(12) United States Patent
Hozumi

(10) Patent No.: US 7,364,095 B2
(45) Date of Patent: Apr. 29, 2008

(54) APPARATUS FOR JUDGING TARGET TO BE TEMPERATURE-REGULATED

(75) Inventor: Yoshiyuki Hozumi, Isehara (JP)

(73) Assignee: Komatsu Electronics Inc., Kanagawa (JP)

( * ) Notice: Subject to any disclaimer, the term of this patent is extended or adjusted under 35 U.S.C. 154(b) by 488 days.

(21) Appl. No.: 11/191,971

(22) Filed: Jul. 29, 2005

(65) Prior Publication Data
US 2006/0191897 A1   Aug. 31, 2006

(30) Foreign Application Priority Data
Jan. 28, 2005  (JP) ............................. 2005-022168

(51) Int. Cl.
*G05D 23/00* (2006.01)
*G01R 31/26* (2006.01)
(52) U.S. Cl. .............................. 236/94; 438/14; 62/126
(58) Field of Classification Search ................ 236/1 C, 236/94; 438/14; 62/129, 259.2
See application file for complete search history.

(56) References Cited

U.S. PATENT DOCUMENTS 5,111,775 A * 5/1992 Sumida et al. ............. 123/41.1

5,577,552 A * 11/1996 Ebinuma et al. ............ 165/296

FOREIGN PATENT DOCUMENTS

JP          2004-169933         6/2004

* cited by examiner

*Primary Examiner*—Marc Norman
(74) *Attorney, Agent, or Firm*—Wenderoth, Lind & Ponack, L.L.P.

(57) ABSTRACT

Between a characteristic a of a process chamber 21*a* having a large pressure loss and a characteristic b of a process chamber 21*b* having a small pressure loss, threshold value A (flow rate value Q3, pressure value P3) is set on the characteristic a. The threshold value A is set on a controller 9. When a rotation speed of a pump 3 is increased by an electric motor 8, the flow rate of a fluid flowing through pipelines 1, 2 and a flow path of a process chamber 21 increases. At the time, the flow rate of the fluid is measured by a flowmeter 4 and a pressure of the fluid is measured by a pressure switch 5. If the pressure reaches the pressure value P3 when the flow rate of the fluid reaches the flow rate value Q3, the pressure switch 5 operates. At the time, the controller 9 judges that the process chamber 21*a* having a large pressure loss is connected to the pipelines 1, 2. Meanwhile, if the pressure does not reach the pressure value P3 when the flow rate of the fluid reaches the flow rate value Q3, the pressure switch 5 does not operate. At the time, the controller 9 judges that the process chamber 21*b* having a small pressure loss is connected to the pipelines 1, 2.

5 Claims, 8 Drawing Sheets

APPARATUS FOR JUDGING TARGET TO BE TEMPERATURE-REGULATED

BACKGROUND OF THE INVENTION

1. Field of the Invention

The present invention relates to an apparatus for judging a target to be temperature-regulated among targets to be temperature-regulated having a different pressure loss when a fluid is supplied from a fluid supply source to the target to be temperature-regulated, e.g., a process chamber used for manufacturing of semiconductor wafers.

2. Description of the Related Art

The semiconductor manufacturing apparatus is provided with a process chamber. A fluid is used to regulate the temperature in the process chamber, and the process chamber is provided with a flow path for flowing the temperature regulating fluid.

FIG. 8 is a diagram showing a conventional fluid supply route.

When an electric motor 8 is activated, a fluid accumulated in a tank 7 is sucked by a pump 3 and discharged to a pipeline 1. The fluid discharged to the pipeline 1 is temperature-regulated by a heat exchanger unit 6 and supplied to a flow path of a process chamber 21. The fluid is flown through the flow path of the process chamber 21 and discharged to the tank 7 via a pipeline 2. Thus, the fluid is circulated through the tank 7 and the process chamber 21.

In the process chamber 21, a semiconductor wafer (hereinafter referred to as the wafer) is processed. Generally, a thermal capacity is large as the wafer has a larger diameter. Therefore, a large flow rate is necessary for the wafer having a larger diameter to obtain a desired target temperature by the process chamber 21. Therefore, the process chamber 21 for processing a large-diameter wafer is configured to have the flow path with a large diameter so as to flow the fluid at a flow rate corresponding to the large-diameter wafer. The process chamber 21 for processing a small-diameter wafer is provided with a flow path having a small diameter to flow the fluid at a flow rate corresponding to the small-diameter wafer. Thus, the process chamber 21 has a different structure for each diameter of the wafers to be processed. Because the process chamber 21 has a different structure, the flow rate of the fluid to be supplied to the process chamber 21, namely a target flow rate, is also different. Therefore, it is necessary to regulate the temperature of the fluid after controlling the flow rate to a target flow rate corresponding to the process chamber 21.

Conventional flow rate control is generally performed by two following methods. One of them uses an inverter to control the rotation speed of the pump, and the other adjusts a closing degree of a manual valve which is disposed on a pipeline. Thus, the flow rate control is performed by a worker who judges the process chamber 21 and operates a changeover switch and the manual valve to adjust the flow rate of the fluid.

Japanese Patent Laid-Open Publication No. 2004-169933 discloses a system which controls an inverter by a controller to control the rotation speed of the pump to adjust a flow rate of the fluid supplied to a process chamber.

The conventional flow rate control requires the judgment of a process chamber by a worker and the operation by the worker. Therefore, there is a high possibility of an operation error by the worker. The possibility of an operation error becomes higher if the worker is not well experienced. To prevent the operation error, it is necessary to establish an operation procedure, to perform through training of workers and the like, and considerable labor and costs are involved. Even if the described methods are adopted, it is impossible to completely eliminate the operation error even if it is possible to decrease the occurrence of the operation error.

To eliminate the operation error, a system which controls a flow rate by an apparatus, e.g., the system disclosed in Japanese Patent Laid-Open Publication No. 2004-169933, may be configured to control the flow rate automatically. To perform the flow rate control full automatically, it is also necessary to perform judgment of the process chamber automatically before the flow rate control. But, there was no existing technology to judge the process chamber.

The present invention has been made in view of the above circumstances and makes it possible to automatically judge a target to be temperature-regulated and to eliminate a setting error of a target flow rate.

SUMMARY OF THE INVENTION

According to a first aspect of the present invention, an apparatus for judging a target to be temperature-regulated, which judges whether a target (21) to be temperature-regulated is a first target to be temperature-regulated having a large pressure loss or a second target to be temperature-regulated having a small pressure loss when a fluid is supplied from a fluid supply source (3) to the target (21) to be temperature-regulated, comprising:

a flow rate adjusting portion (8) which adjusts a flow rate of the fluid supplied to the target (21) to be temperature-regulated;

a flow rate measuring portion (4) which measures the flow rate of the fluid;

a pressure measuring portion (5) which measures a pressure of the fluid; and a judgment section (9) which judges, when a prescribed flow rate value (Q3) and a prescribed pressure value (P3) on a corresponding relationship (a) between the flow rate and the pressure of the fluid supplied to the first target to be temperature-regulated are determined in advance and the flow rate is adjusted by the flow rate adjusting portion (8), that the target to be temperature-regulated is the first target to be temperature-regulated if the measured value of the flow rate measuring portion (4) reaches the prescribed flow rate value (Q3) and the measured value of the pressure measuring portion (5) reaches the prescribed pressure value (P3), but if not, judges that the target to be temperature-regulated is the second target to be temperature-regulated.

According to a second aspect of the present invention, the pressure measuring portion (5) in the first aspect of the present invention is a pressure switch.

The first and second aspects of the present invention will be described with reference to FIG. 1 and FIG. 3. It is assumed in the description below that the fluid supply source is a pump 3, the first target to be temperature-regulated is a process chamber 21a having a large pressure loss, the second target to be temperature-regulated is a process chamber 21b having a small pressure loss, the flow rate adjusting portion is an electric motor 8, the flow rate measuring portion is a flowmeter 4, the pressure measuring portion is a pressure switch 5, and the judgment section is a controller 9.

The first and second aspects of the present invention judge the process chambers 21 according to a difference in pressure loss of the process chambers 21, thereby discriminating between the process chamber 21a having a large pressure loss and the process chamber 21b having a small pressure loss.

As shown in FIG. 3, when the fluid is supplied from the pump 3 to the process chamber 21, a corresponding relationship between a flow rate and a pressure of the fluid discharged from the pump 3 is variable depending on the pressure loss of the process chamber 21. Then, threshold value A (flow rate value Q3, pressure value P3) is set on the characteristic a of the process chamber 21a having a large pressure loss. The pressure value P3 of the threshold value A is set on the pressure switch 5, and the flow rate value Q3 of the threshold value A is set on the controller 9.

When the rotation speed of the pump 3 is increased by the electric motor 8, the flow rate of the fluid flowing through the pipelines 1, 2 and the flow path of the process chamber 21 increases. At this time, the flow rate of the fluid is measured by the flowmeter 4, and the pressure of the fluid is measured by the pressure switch 5.

The pressure switch 5 operates when the pressure of the fluid reaches the pressure value P3 when the flow rate of the fluid reaches a flow rate value Q3. The operation of the pressure switch 5 at the flow rate value Q3 means that the flow path of the process chamber 21a having a large pressure loss is connected to the pipelines 1, 2. Therefore, the controller 9 judges that the process chamber 21a having a large pressure loss is connected to the pipelines 1, 2.

Meanwhile, the pressure switch 5 does not operate when the pressure of the fluid does not reach the pressure value P3 when the flow rate of the fluid reaches the flow rate value Q3. No operation of the pressure switch 5 at the flow rate value Q3 means that the flow path of the process chamber 21b having a small pressure loss is connected to the pipelines 1, 2. Therefore, the controller 9 judges that the process chamber 21b having a small pressure loss is connected to the pipelines 1, 2.

According to a third aspect of the present invention, an apparatus for judging a target to be temperature-regulated, which judges that a target (21) to be temperature-regulated is which of targets to be temperature-regulated having a different pressure loss when a fluid is supplied from a fluid supply source (3) to the target (21) to be temperature-regulated, comprising:

a flow rate adjusting portion (8) which adjusts a flow rate of the fluid supplied to the target (21) to be temperature-regulated;

a flow rate measuring portion (4) which measures the flow rate of the fluid;

a pressure measuring portion (15) which measures a pressure of the fluid; and a judgment section (9) which judges a target to be temperature-regulated among the individual targets to be temperature-regulated by determining in advance corresponding relationships (a, c, b) between a flow rate and a pressure of a fluid supplied to the target to be temperature-regulated for each of the individual targets to be temperature-regulated, and judging that a flow rate measured value and a pressure measured value of the flow rate measuring portion (4) and the pressure measuring portion (15) obtained by adjusting the flow rate by the flow rate adjusting portion (8) agree with any of the corresponding relationships (a, c, b).

The third aspect of the present invention will be described with reference to FIG. 5 and FIG. 6. It is assumed in the description below that the fluid supply source is a pump 3, the targets to be temperature-regulated are process chambers 21a, 21b, 21c, the flow rate adjusting portion is the pump 3, the flow rate measuring portion is a flowmeter 4, the pressure measuring portion is a pressure gage 15, the flow rate increasing portion is an electric motor 8 and the judgment section is a controller 9.

The third aspect of the present invention judges the process chambers 21 according to a difference in pressure loss of the process chambers 21 to judge one among the plural process chambers 21a, 21b, 21c.

As shown in FIG. 6, when the fluid is supplied from the pump 3 to the process chamber 21, a corresponding relationship between a flow rate and a pressure of the fluid discharged from the pump 3 is variable depending on the pressure loss of the process chamber 21. Accordingly, for the controller 9, a corresponding relationship between the flow rate and the pressure of each process chamber 21 is set. For example, characteristics a, b, c indicating the corresponding relationships are set to judge the three process chambers 21a, 21b, 21c as shown in FIG. 6.

When the rotation speed of the pump 3 is increased by the electric motor 8, the flow rate of the fluid flowing through the pipelines 1, 2 and the flow path of the process chamber 21 increases. At the time, the flow rate of the fluid is measured by the flowmeter 4, and the pressure of the fluid is measured by the pressure gage 15.

When the measured value of the flowmeter 4 is a flow rate Qa' and the measured value of the pressure gage 15 is a pressure P', the measured flow rate value Qa' and pressure value P' agree with the characteristic a of the process chamber 21a. Therefore, the controller 9 judges that the process chamber 21a is connected to the pipelines 1, 2.

When the measured value of the flowmeter 4 is a flow rate Qb' and the measured value of the pressure gage 15 is a pressure P', the measured flow rate value Qb' and pressure value P' agree with the characteristic b of the process chamber 21b. Therefore, the controller 9 judges that the process chamber 21b is connected to the pipelines 1, 2.

When the measured value of the flowmeter 4 is a flow rate Qc' and the measured value of the pressure gage 15 is a pressure P', the measured flow rate value Qc' and pressure value P' agree with the characteristic c of the process chamber 21c. Therefore, the controller 9 judges that the process chamber 21c is connected to the pipelines 1, 2.

According to a fourth aspect of the present invention, a target flow rate in the first and third aspects of the present invention is set for each of the targets to be temperature-regulated; and the flow rate is adjusted by the flow rate adjusting portion (8) to enable to obtain the target flow rate set for the target to be temperature-regulated judged by the judgment section (9).

The controller 9 (judgment section) instructs a target flow rate corresponding to the judged process chamber 21 to the electric motor (flow rate adjusting portion) 8. The electric motor 8 controls the pump 3 so that the instructed target flow rate can be obtained. Thus, the flow rate of the fluid discharged from the pump 3 is adjusted.

According to the present invention, the target to be temperature-regulated can be judged automatically. Therefore, a setting error of the target flow rate resulting from an operation error by a worker can be eliminated.

DETAILED DESCRIPTION OF THE INVENTION

Embodiments of the present invention will be described with reference to the accompanying drawings.

In the embodiments below, a process chamber disposed on a semiconductor manufacturing apparatus will be described as the "target to be temperature-regulated".

The process chamber generally has a different structure depending on a size of a wafer to be thermally treated.

A small-size wafer has small thermal capacity. Therefore, a small amount of temperature-regulating fluid is used to raise a small-size wafer to a prescribed temperature. And, a process chamber for thermal processing of the small-size wafer is provided with a small-diameter flow path to flow a small amount of fluid in correspondence with the small thermal capacity.

Meanwhile, a large-size wafer has large thermal capacity. Therefore, a large amount of temperature-regulating fluid is used to raise the large-size wafer to a prescribed temperature. And, a process chamber for thermal treatment of the large-size wafer is provided with a large-diameter flow path to flow a large amount of fluid in correspondence with the large thermal capacity.

Thus, the flow path has a different diameter for the individual process chambers. Then, piping resistance is different, and the fluid also has a different pressure loss. According to the embodiments of the invention, a difference in pressure loss of the process chamber is utilized to judge the process chamber, a flow rate of the fluid is controlled to a target flow rate corresponding to the process chamber, and the temperature of the fluid is regulated accordingly.

Embodiment 1

At present, the process chamber is generally divided into two types, one (hereinafter referred to as the 200-mm chamber) for a 200-mm diameter wafer and the other (hereinafter referred to as the 300-mm chamber) for a 300-mm diameter wafer. Then, it is described in the first embodiment that one of two process chambers having a different pressure loss is judged, and a flow rate for supplying to the process chamber is controlled to a target flow rate corresponding to the judged process chamber.

Figure 1:
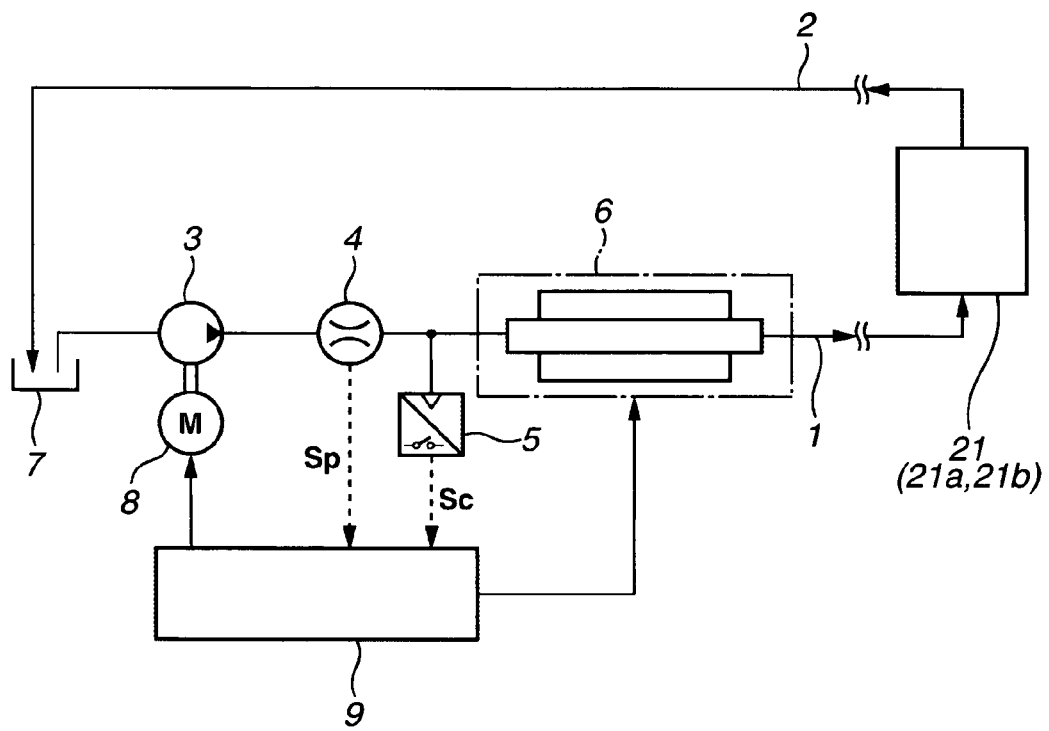
FIG. 1 is a diagram showing a fluid supply route according to a first embodiment.

FIG. 1 is a diagram showing a fluid supply route according to the first embodiment.

Pipelines 1, 2 are flow paths for a fluid circulating between a process chamber 21 and a tank 7. The pipeline 1 communicates a discharge port of a pump 3 and a supply port of a flow path of the process chamber 21. The pipeline 2 communicates an outlet port of the flow path of the process chamber 21 and the tank 7. A temperature-regulating fluid, e.g., water, is stored in the tank 7. The pipeline 1 is provided with a flowmeter 4, a pressure switch 5 and a heat exchanger unit 6. The rotation shaft of the pump 3 is connected to the rotation shaft of an electric motor 8. The pump 3 sucks the fluid accumulated in the tank 7 through the inlet port in accordance with the drive of the electric motor 8 and discharges the sucked fluid to the pipeline 1 through the discharge port. The flowmeter 4 is mounted downstream of the pump 7. The flowmeter 4 measures a flow rate of the fluid discharged from the pump 3 and transmits the measured value as a pulse signal Sp to the controller 9. The heat exchanger unit 6 is disposed downstream of the flowmeter 4. The heat exchanger unit 6 is provided with a thermoelectric conversion element module which is comprised of plural thermoelectric conversion elements and electrodes and changes heat absorption, heat generation and heat quantity according to a current conducting direction and a change in the supplied power. The pressure switch 5 measures a pressure of the fluid flowing through the pipeline 1, and when the fluid exceeds a pressure threshold value, transmits a contact signal Sc to the controller 9. A pressure sensor may be disposed instead of the pressure switch 5.

Figure 2:
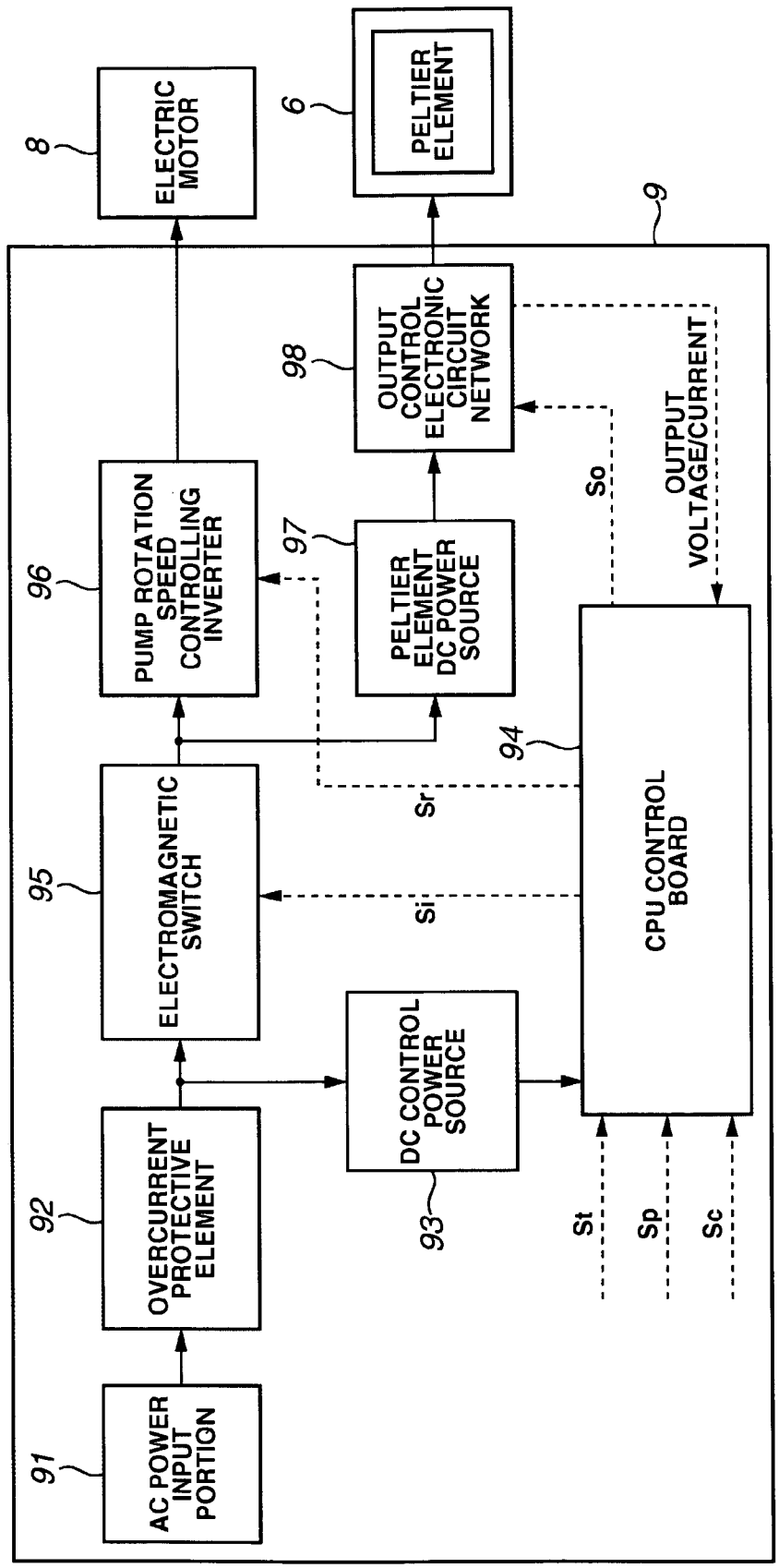
FIG. 2 is a block diagram of a controller.

FIG. 2 is a block view of the controller 9.

When an AC voltage is applied to an AC power input portion 91, the AC voltage is applied to a DC control power source 93 via an overcurrent protective element 92. The DC control power source 93 converts the AC voltage to a DC voltage and applies it to a CPU control board 94. When a current conduction enable signal Si is transmitted from the CPU control board 94 to an electromagnetic switch 95, the electromagnetic switch 95 is closed. Then, AC voltage is applied to a pump rotation speed controlling inverter 96 and a thermoelectric conversion element DC power source 97. The pump rotation speed controlling inverter 96 converts the AC voltage to a DC voltage once, further converts the DC voltage to an AC voltage with a frequency corresponding to a rotation speed command signal Sr transmitted from the CPU control board 94 and applies it to the electric motor 8. The thermoelectric conversion element DC power source 97 converts the AC voltage to a DC voltage and applies it to an output control electronic circuit network 98. The output control electronic circuit network 98 applies a DC voltage corresponding to an output command signal So, which is transmitted from the CPU control board 94, to the heat exchanger unit 6. And, the output control electronic circuit network 98 controls to start/stop the operation of the heat exchanger unit 6 according to an operation command signal So transmitted from the CPU control board 94.

On the CPU control board 94, target flow rates are set for the individual process chambers 21, namely a target flow rate Q1 of a 200-mm chamber 21a and a target flow rate Q2 of a 300-mm chamber 21b, and a target temperature of the fluid is set for the individual process chambers 21. The target flow rates and the target temperatures are set through an unshown input device, such as ten keys.

The CPU control board 94 receives a pulse signal Sp transmitted from the flowmeter 4, a contact signal Sc transmitted from the pressure switch 5 and a fluid temperature signal St transmitted from the heat exchanger unit 6. And, the CPU control board 94 transmits the rotation speed command signal Sr instructing a rotation speed of the electric motor 8 to the pump rotation speed controlling inverter 96, and the output command signal So instructing the supplied power and current conducting direction of the heat exchanger unit 6 to the output control electronic circuit network 98. The CPU control board 94 judges the process chambers 21 depending on whether the contact signal Sc is received. And, the CPU control board 94 performs feedback control according to the pulse signal Sp (flow rate value) which is transmitted from the flowmeter 4 such that the flow rate of the fluid becomes a target flow rate corresponding to the process chamber 21. And, the CPU control board 94 performs feedback control according to the fluid temperature signal St (temperature value) which is transmitted from the heat exchanger unit 6 such that the temperature of the fluid becomes a target temperature.

Figure 3:
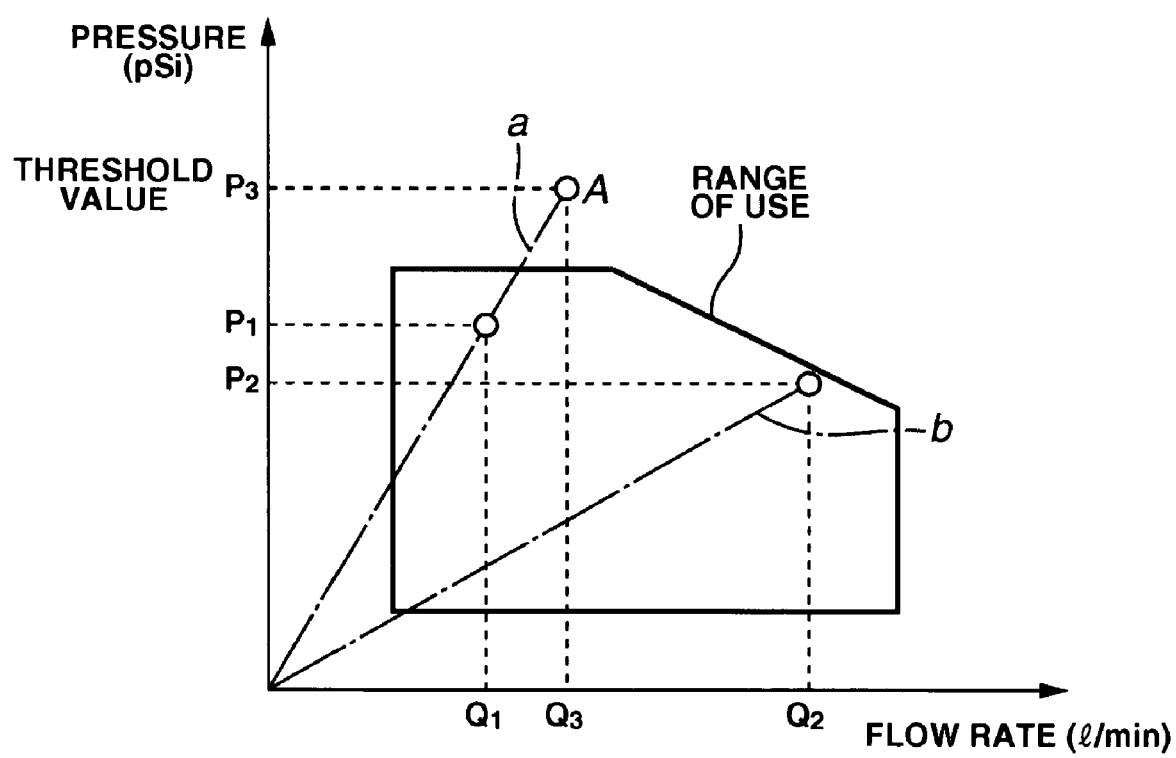
FIG. 3 is a diagram illustrating target flow rate judgment processing of the first embodiment.

FIG. 3 is a diagram illustrating target flow rate judgment processing of the first embodiment.

The horizontal axis of FIG. 3 indicates a flow rate (1/min) of a fluid discharged per minute from the pump 3, and the vertical axis indicates a pressure (psi) of the fluid flowing through the pipeline 1. As shown in FIG. 3, where a wafer is processed in the 200-mm chamber 21a, the flow rate is determined to be a target flow rate Q1 (1/min). The pressure at the time is P1 (psi). And, where a wafer is processed in the 300-mm chamber 21b, the flow rate is determined to be a target flow rate Q2 (>Q1) (1/min). The pressure at the time is P2 (<P1) (psi).

The flow rate and the pressure of the fluid discharged from the pump 3 are proportionally related with each other. If the rotation speed of the electric motor 8 is increased when the pipelines 1, 2 and the flow paths of the 200-mm chamber 21a are connected, the flow rate and the pressure increase along the characteristic a shown in FIG. 3. If the rotation speed of the electric motor 8 is increased when the pipelines 1, 2 and the flow paths of the 300-mm chamber 21b are connected, the flow rate and the pressure increase along the characteristic b shown in FIG. 3. Differences between the characteristics a and b shown in FIG. 3 are produced as a result of the difference in the pressure loss of the flow paths of the process chamber 21.

It is apparent from the characteristics a, b shown in FIG. 3 that a pressure loss of the 200-mm chamber 21a is larger than that of the 300-mm chamber 21b. Accordingly, a threshold value A (=pressure value P3>P1>P2) is set on the characteristic a of the 200-mm chamber 21a having a large pressure loss. In this embodiment, when the pressure of the fluid reaches a pressure value P3, the pressure switch 5 activates to transmit the contact signal Sc. And, a flow rate value Q3 corresponding to the pressure value P3 is set.

Judgment of the process chamber and flow rate control of the first embodiment are performed as follows.

Figure 4:
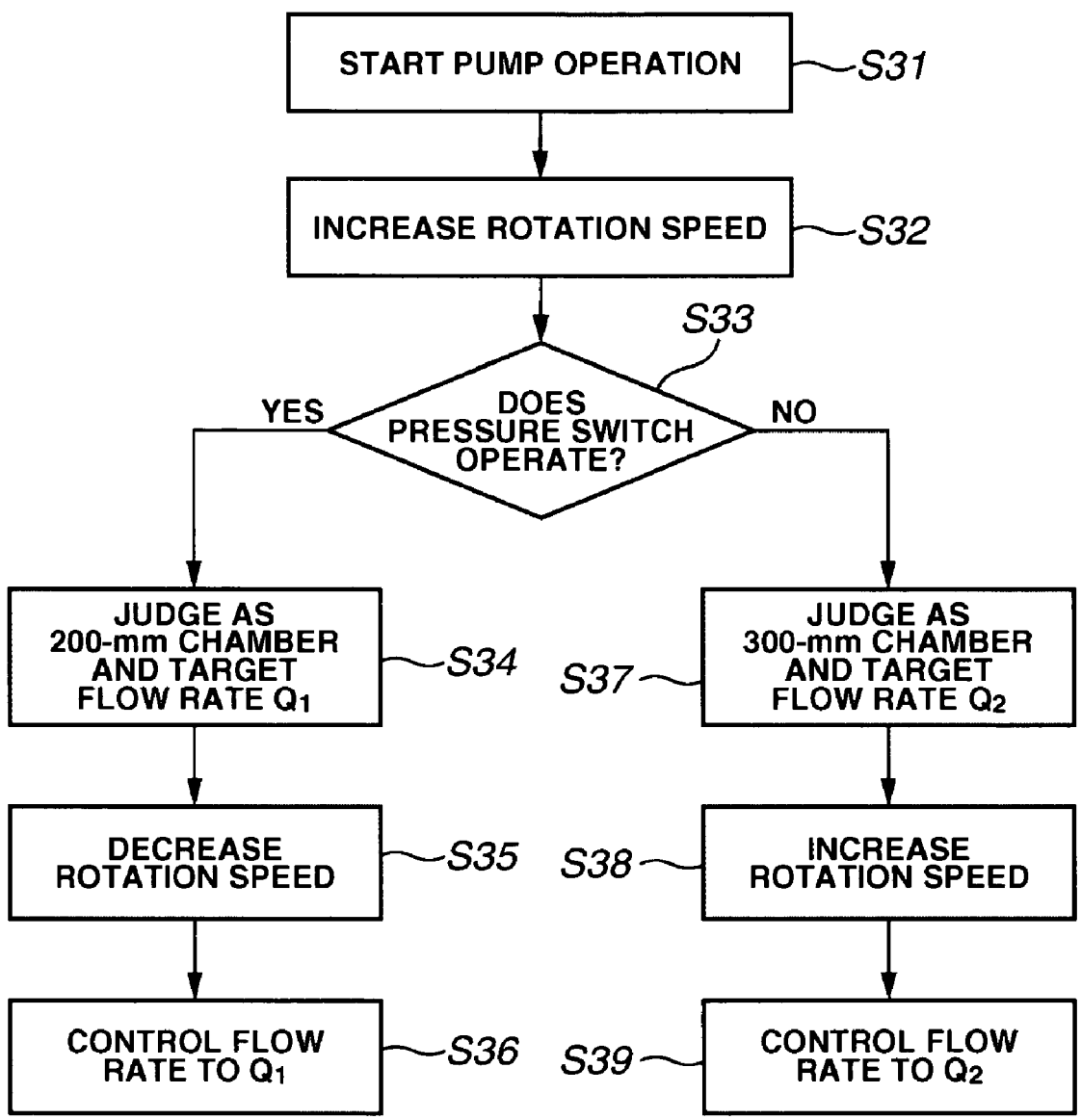
FIG. 4 is a flow chart of judgment of a target flow rate and control of a flow rate performed in the first embodiment.

FIG. 4 is a flow chart of the judgment of the process chamber and flow rate control performed in the first embodiment.

The individual devices are turned on, and the electric motor 8 is driven to start operating the pump 3 (step S31). The rotation speed of the electric motor 8 is increased gradually to increase a discharge flow rate of the pump 3 (step S32).

If the pressure P reaches P3 when the flow rate Q reaches Q3, the pressure switch 5 operates to transmit the contact signal Sc to the CPU control board 94 of the controller 9 (step S33: YES). Upon receiving the contact signal Sc, the CPU control board 94 judges that the process chamber 21 is the 200-mm chamber 21a and the target flow rate is Q1 (step S34). The target flow rate Q1 is smaller than the flow rate value Q3, so that the rotation speed of the pump 3 is decreased (step S35). The CPU control board 94 compares the target flow rate Q1 of the 200-mm chamber 21a with the measured value Q of the flowmeter 4 and transmits the rotation speed command signal Sr to the pump rotation speed controlling inverter 96 to make the difference zero. The pump rotation speed controlling inverter 96 controls the rotations of the electric motor 8 according to the rotation speed command signal Sr. Thus, feedback control of the target flow rate corresponding to the 200-mm chamber 21a is performed (step S36). Feedback control of the target temperature is also performed.

Meanwhile, if the pressure P does not reach P3 when the flow rate Q reaches Q3, the pressure switch 5 does not operate, and the contact signal Sc is not transmitted to the CPU control board 94 of the controller 9 (step S33: NO). Because the CPU control board 94 does not receive the contact signal Sc, it judges that the process chamber 21 is the 300-mm chamber 21b and that the target flow rate is Q2 (step S37). The target flow rate Q2 is larger than the flow rate value Q3, so that the rotation speed of the pump 3 is increased (step S38). The CPU control board 94 compares the target flow rate Q2 of the 300-mm chamber 21b with the measured value Q of the flowmeter 4 and transmits the rotation speed command signal Sr to the pump rotation speed controlling inverter 96 to make the difference zero. The pump rotation speed controlling inverter 96 controls the rotations of the electric motor 8 according to the rotation speed command signal Sr. Thus, feedback control of the target flow rate corresponding to the 300-mm chamber 21b is performed (step S39). And, the feedback control of the target temperature is also performed.

The pressure switch 5 is used in this embodiment, but it may be configured to measure a pressure by the pressure gage and to judge by the controller 9 whether the pressure has reached the pressure value P3 of the threshold value A.

According to the first embodiment, the process chamber can be judged according to only the presence or not of the contact signal Sc transmitted from the pressure switch, and the flow rate of the fluid can be controlled by use of a target flow rate corresponding to the judged process chamber. Thus, the process chamber is automatically judged without an aid of a worker. Therefore, the target flow rate value can be prevented from being set erroneously because of an operation error by the worker. And, the apparatus configuration and control contents of this embodiment are very simple and the apparatus itself can be managed easily.

Embodiment 2

The first embodiment judges two process chambers and controls the flow rate. But, it is sometimes necessary to judge three or more process chambers. Therefore, it is described in the second embodiment that three process chambers 21a, 21b, 21c having a different pressure loss are judged, and control is performed to have a target flow rate corresponding to the judged process chamber.

Figure 5:
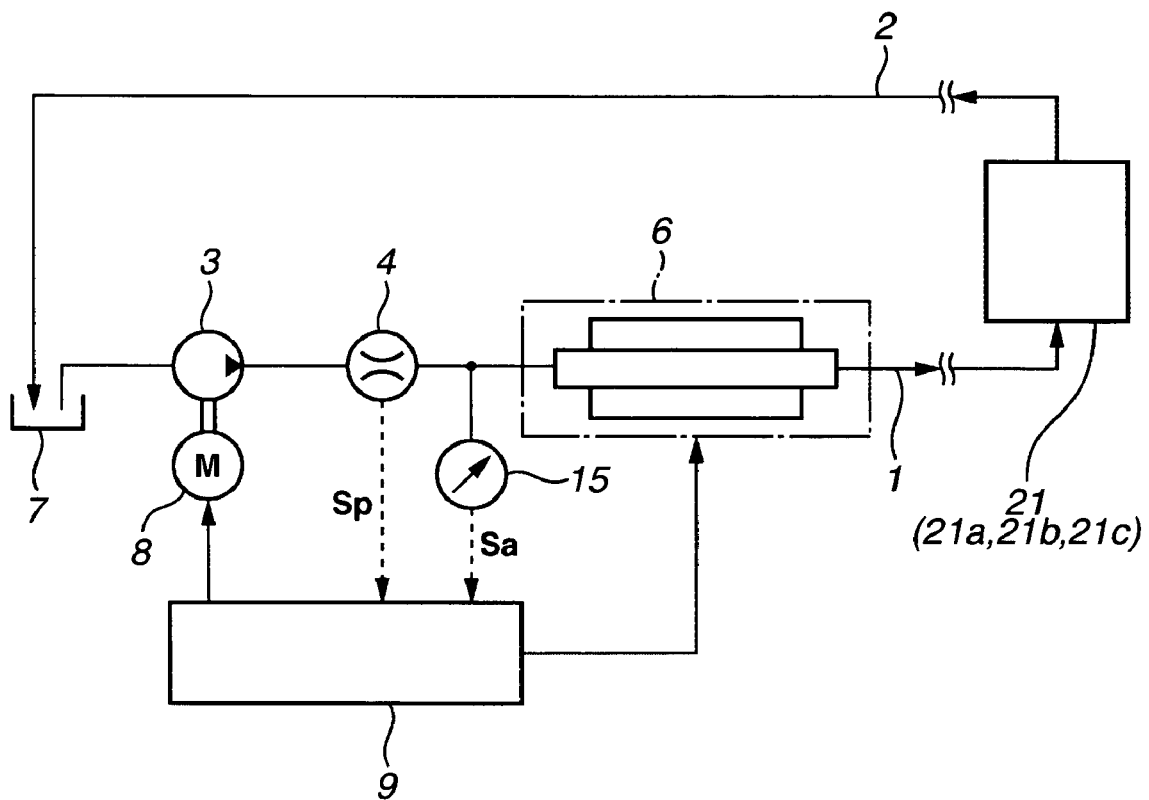
FIG. 5 is a diagram showing a fluid supply route according to a second embodiment.

FIG. 5 is a diagram showing a fluid supply route according to the second embodiment.

The structure of the second embodiment shown in FIG. 5 is substantially the same as that of the first embodiment shown in FIG. 1. There is a difference between them that a pressure gage 15 is used instead of the pressure switch 5. The internal structure of the controller 9 is also the same as that shown in FIG. 2, but the contents of processing performed by the CPU control board 94 are different.

Figure 6:
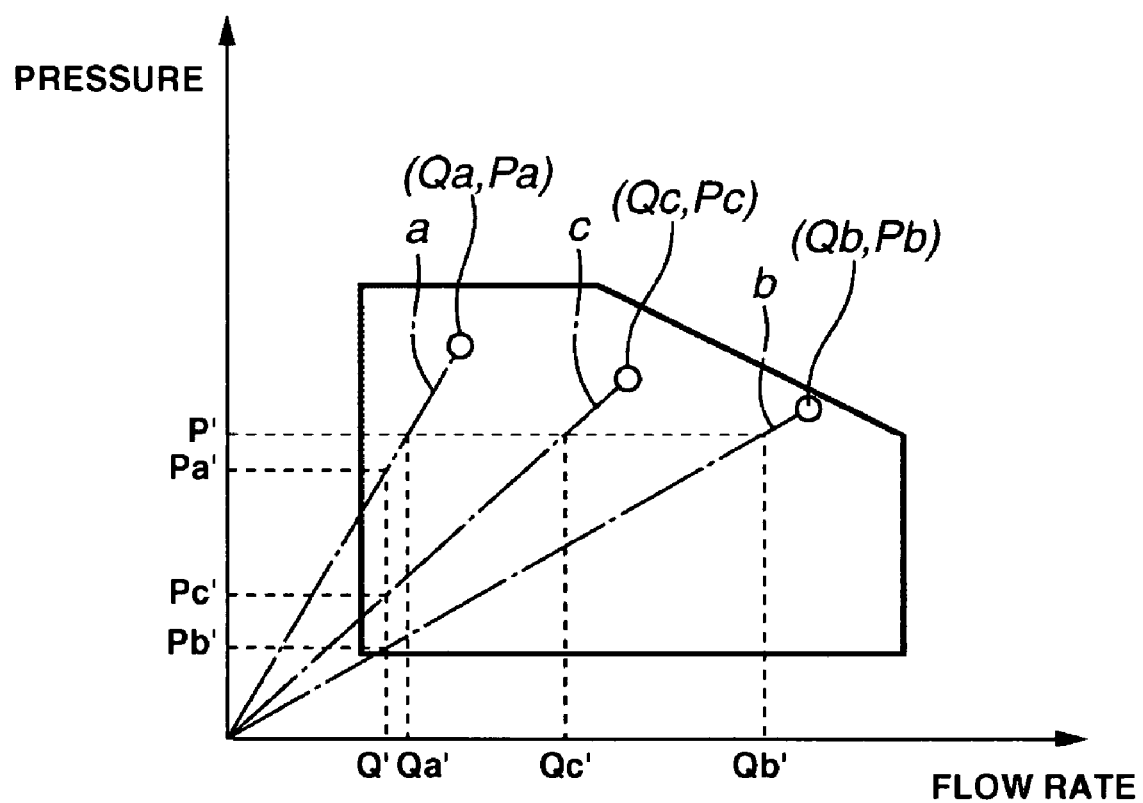
FIG. 6 is a diagram illustrating flow rate control processing of the second embodiment.

The CPU control board 94 is set to have a corresponding relationship between a flow rate and a pressure for each process chamber 21. And, a corresponding target flow rate is determined for each of the process chambers 21. For example, a characteristic a of the process chamber 21a, a characteristic b of the process chamber 21b, and a characteristic c of the process chamber 21c shown in FIG. 6 are set as a table, and target flow rates corresponding to the process chambers 21a, 21b, 21c are set. The CPU control board 94 judges the process chambers 21 according to which characteristic agrees with the measured flow rate and pressure and judges the target flow rate corresponding to the judged process chamber.

The judgment of the process chambers and the control of the flow rate are performed as follows in the second embodiment.

Figure 7:
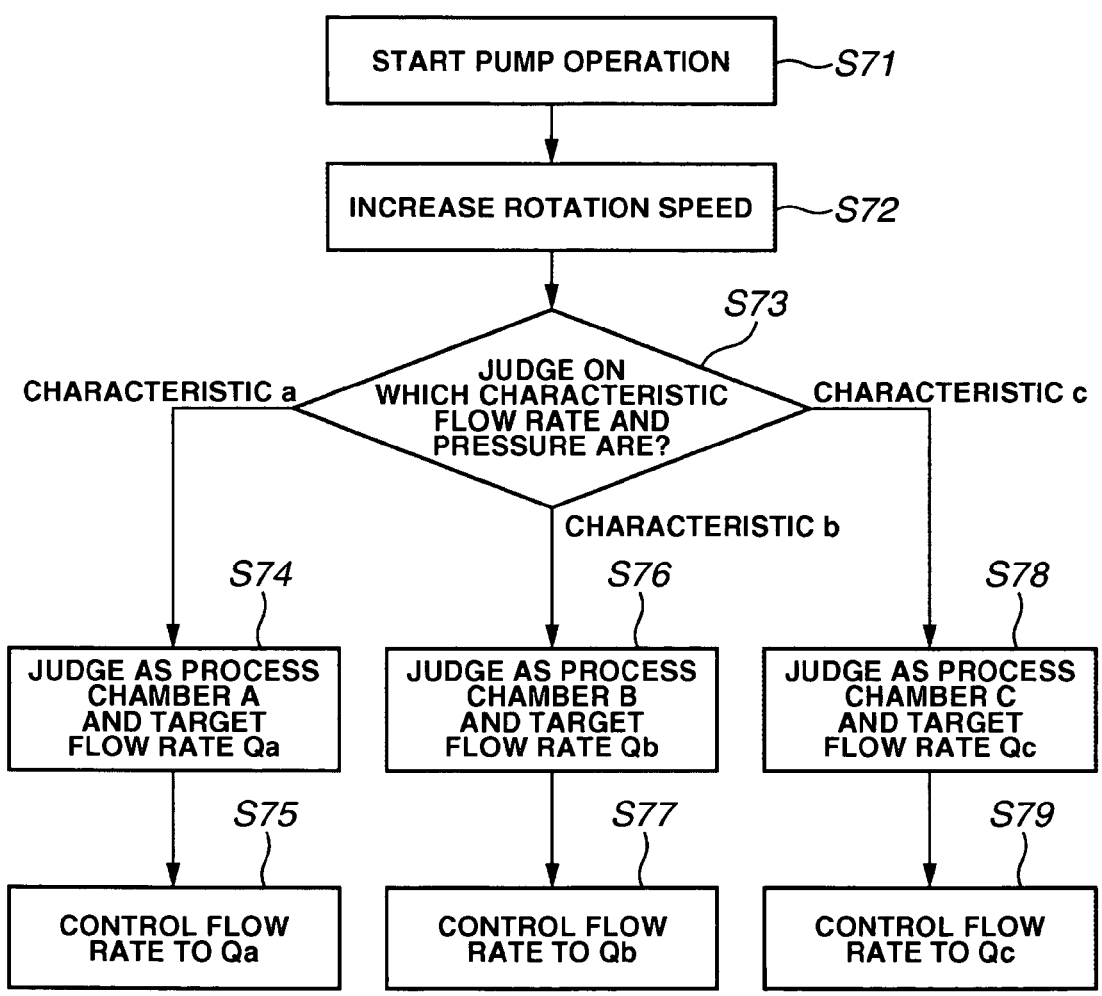
FIG. 7 is a flow chart of judgment of a target flow rate and control of a flow rate performed in the second embodiment.
Figure 8:
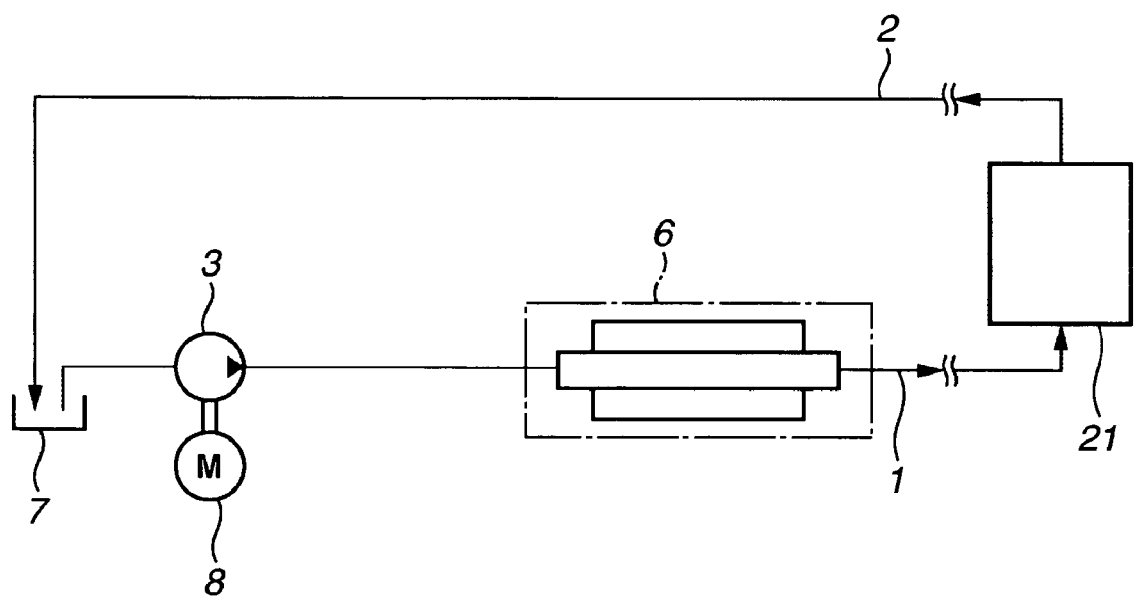
FIG. 8 is a diagram showing a conventional fluid supply route.

FIG. 7 is a flow chart of the judgment of the process chambers and the control of the flow rate performed in the second embodiment.

The individual devices are turned on, the electric motor 8 is driven to start operating the pump 3 (step S71). The rotation speed of the electric motor 8 is increased gradually to increase a discharge flow rate of the pump 3 (step S72).

A pulse signal Sp transmitted from the flowmeter 4 and a pressure signal Sa transmitted from the pressure gage 15 are received by the CPU control board 94 of the controller 9. The CPU control board 94 judges which of the set characteristic a, characteristic b and characteristic c agrees with a flow rate value Q and a pressure value P which are measured at the right time (step S73).

Where the flow rate value Q and the pressure value P are Qa' and P', the flow rate value Qa' and the pressure value P' are on the characteristic a of the process chamber 21a as shown in FIG. 6. In this case, the CPU control board 94 judges that the process chamber 21 is the process chamber 21a and that the target flow rate is Qa (step S74: a, step S74). The CPU control board 94 compares the target flow rate Qa of the process chamber 21a with the measured value Q of the flowmeter 4 and transmits the rotation speed command signal Sr to the pump rotation speed controlling inverter 96 to make the difference zero. The pump rotation speed controlling inverter 96 controls the rotations of the electric motor 8 according to the rotation speed command signal Sr. Thus, the feedback control of the target flow rate corresponding to the process chamber 21a is performed (step S75). And, the feedback control of the target temperature is also performed.

Where the flow rate value Q and the pressure value P are Qb' and P', the flow rate value Qb' and the pressure value P' are on the characteristic b of the process chamber 21b as shown in FIG. 6. In this case, the CPU control board 94 judges that the process chamber 21 is the process chamber 21b and that the target flow rate is Qb (step S74: b, step S76). The CPU control board 94 compares the target flow rate Qb of the process chamber 21b and the measured value Q of the flowmeter 4 and transmits the rotation speed command signal Sr to the pump rotation speed controlling inverter 96 to make the difference zero. The pump rotation speed controlling inverter 96 controls the rotations of the electric motor 8 according to the rotation speed command signal Sr. Thus, the feedback control of the target flow rate corresponding to the process chamber 21b is performed (step S77). And, the feedback control of the target temperature is also performed.

Where the flow rate value Q and the pressure value P are Qc' and P', the flow rate value Qc' and the pressure value P' are on the characteristic c of the process chamber 21c as shown in FIG. 6. In this case, the CPU control board 94 judges that the process chamber 21 is the process chamber 21c and that the target flow rate is Qc (step S74: c, step S78). The CPU control board 94 compares the target flow rate Qc of the process chamber 21c and the measured value Q of the flowmeter 4 and transmits the rotation speed command signal Sr to the pump rotation speed controlling inverter 96 to make the difference zero. The pump rotation speed controlling inverter 96 controls the rotations of the electric motor 8 according to the rotation speed command signal Sr.

Thus, the feedback control of the target flow rate corresponding to the process chamber 21c is performed (step S79). And, the feedback control of the target temperature is also performed.

The second embodiment also includes a mode that an arbitrary pressure value P', a flow rate value Qa' of the process chamber 21a corresponding to the pressure value P', a flow rate value Qb' of the process chamber 21b and a flow rate value Qc' of the process chamber 21c only are set on the CPU control board 94. In this mode, when the pressure of the fluid becomes P', it is judged that the flow rate is Qa', Qb' or Qc', the process chamber 21 is judged depending on the judged result, and the target flow rate is judged. In this mode, a pressure switch may be disposed instead of the pressure gage 15.

Similarly, the second embodiment also includes a mode that an arbitrary flow rate value Q', a pressure value Pa' of the process chamber 21a corresponding to the flow rate value Q', a pressure value Pb' of the process chamber 21b and a pressure value Pc' of the process chamber 21c only are set on the CPU control board 94. In this mode, when the flow rate of the fluid becomes Q', it is judged that the pressure is Pa', Pb' or Pc', the process chamber 21 is judged depending on the judged result, and the target flow rate is judged.

The second embodiment can also be applied to judgment of two process chambers and judgment of four or more process chambers.

According to the second embodiment, the process chamber can be judged by use of a corresponding relationship of the preset flow rate and pressure, and the flow rate of the fluid can be controlled by use of the target flow rate corresponding to the judged process chamber. Thus, the process chamber is automatically judged without an aid of a worker. Therefore, the target flow rate value can be prevented from being set erroneously because of an operation error by the worker.

It was described in the first and second embodiments that the target to be temperature-regulated was a process chamber. But, the present invention is not limited to what were described above. For example, the present invention can also be applied to a susceptor and the like.

What is claimed is:

1. An apparatus for judging a target to be temperature-regulated, which judges whether a target to be temperature-regulated is a first target to be temperature-regulated having a large pressure loss or a second target to be temperature-regulated having a small pressure loss when a fluid is supplied from a fluid supply source to the target to be temperature-regulated, comprising:

a flow rate adjusting means which adjusts a flow rate of the fluid supplied to the target to be temperature-regulated;

a flow rate measuring means which measures the flow rate of the fluid;

a pressure measuring means which measures a pressure of the fluid; and a judgment means which judges, when a prescribed flow rate value Q3 and prescribed pressure value P3 on a corresponding relationship between the flow rate and the pressure of the fluid supplied to the first target to be temperature-regulated are determined in advance and the flow rate is adjusted by the flow rate adjusting means, that the target to be temperature-regulated is the first target to be temperature-regulated if the measured value of the flow rate measuring means reaches the prescribed flow rate value Q3 and the measured value of the pressure measuring means reaches the prescribed pressure value P3, but if not, judges that the target to be temperature-regulated is the second target to be temperature-regulated.

2. The apparatus for judging a target to be temperature-regulated according to claim 1, wherein the pressure measuring means is a pressure switch.

3. The apparatus for judging a target to be temperature-regulated according to claim 1, wherein:
a target flow rate is set for each of the targets to be temperature-regulated; and
the flow rate is adjusted by the flow rate adjusting means to enable to obtain the target flow rate set for the target to be temperature-regulated judged by the judgment means.

4. An apparatus for judging a target to be temperature-regulated, which judges that a target to be temperature-regulated is which of targets to be temperature-regulated having a different pressure loss when a fluid is supplied from a fluid supply source to the target to be temperature-regulated, comprising:
a flow rate adjusting means which adjusts a flow rate of the fluid supplied to the target to be temperature-regulated;
a flow rate measuring means which measures the flow rate of the fluid;
a pressure measuring means which measures a pressure of the fluid; and
a judgment means which judges a target to be temperature-regulated among the individual targets to be temperature-regulated by determining in advance corresponding relationships between a flow rate and a pressure of a fluid supplied to the target to be temperature-regulated for each of the individual targets to be temperature-regulated, and judging that the flow rate measured value of the flow rate measuring means and the pressure measured value of the pressure measuring means that are obtained by adjusting the flow rate by the flow rate adjusting means agree with any of the corresponding relationships.

5. The apparatus for judging a target to be temperature-regulated according to claim 4, wherein:
a target flow rate is set for each of the targets to be temperature-regulated; and
the flow rate is adjusted by the flow rate adjusting means to enable to obtain the target flow rate set for the target to be temperature-regulated judged by the judgment means.

\* \* \* \* \*